(12) United States Patent
Iltis et al.

(10) Patent No.: US 7,332,028 B2
(45) Date of Patent: Feb. 19, 2008

(54) METHOD FOR MANIPULATING A RARE EARTH CHLORIDE OR BROMIDE OR IODIDE IN A CRUCIBLE COMPRISING CARBON

(75) Inventors: Alain Iltis, Montigny sur Loing (FR); Vladimir Ouspenski, Nemours (FR)

(73) Assignee: Saint-Gobain Cristaux et Detecteurs, Courbevoie (FR)

( * ) Notice: Subject to any disclaimer, the term of this patent is extended or adjusted under 35 U.S.C. 154(b) by 395 days.

(21) Appl. No.: 10/515,349

(22) PCT Filed: Jun. 11, 2003

(86) PCT No.: PCT/FR03/01735

§ 371 (c)(1),
(2), (4) Date: Dec. 3, 2004

(87) PCT Pub. No.: WO03/106741

PCT Pub. Date: Dec. 24, 2003

(65) Prior Publication Data

US 2005/0188914 A1 Sep. 1, 2005

(30) Foreign Application Priority Data

Jun. 12, 2002 (FR) .................. 02 07187

(51) Int. Cl.
*C30B 15/20* (2006.01)
(52) U.S. Cl. .................. 117/13; 117/2; 117/3
(58) Field of Classification Search .................. 117/2, 117/3, 13
See application file for complete search history.

(56) References Cited

U.S. PATENT DOCUMENTS

| 3,959,442 A | 5/1976 | Robinson et al. |
| 4,251,315 A | 2/1981 | Pastor et al. |
| 5,911,824 A | 6/1999 | Grencewicz et al. |
| 6,093,245 A | 7/2000 | Grencewicz et al. |
| 7,067,815 B2 | 6/2006 | Dorenbos et al. |
| 7,067,816 B2 | 6/2006 | Dorenbos et al. |
| 2006/0104880 A1 | 5/2006 | Iltis |

FOREIGN PATENT DOCUMENTS

| DE | 44 43 001 | 6/1995 |
| JP | 03 285898 | 12/1991 |
| WO | 01 60944 | 8/2001 |
| WO | 01 60945 | 8/2001 |

OTHER PUBLICATIONS

Korczak et al: "Crystal growth and temperature variation of the lattice parameters in LaF3, CeF3, PrF3 and NdF3" Journal of Crystal Growth., vol. 61, No. 3, pp. 601-605, 1983.
Blistanov A A et al: "Peculiarities of the growth of disordered Na, R-fluorite (R=Y, Ce-Lu) single crystals" Journal of Crystal Growth, vol. 237-239, pp. 899-903, Apr. 2002.
Duffy S et al: "Bridgman growth and laser excitation of LiYF4:Sm3+" Journal of Crystal Growth, vol. 203, No. 3, pp. 405-411, Jun. 1999.
U.S. Appl. No. 10/535,818 filed Dec. 7, 2005 Iltis.
U.S. Appl. No. 10/515,349, filed Dec. 3, 2004 Iltis et al.
U.S. Appl. No. 11/578,379, filed Oct. 13, 2006 Iltis.
U.S. Appl. No. 10/515,349, filed Dec. 3, 2004 Iltis et al.
U.S. Appl. No. 10/559,338, filed Nov. 17, 2006 Dorenbos et al.
U.S. Appl. No. 10/515,349, filed Dec. 3, 2004 Iltis et al.

*Primary Examiner*—Felisa Hiteshew
(74) *Attorney, Agent, or Firm*—Oblon, Spivak, McClelland, Maier & Neustadt, P.C.

(57) ABSTRACT

The invention relates to the handling of a composition comprising a rare-earth halide, especially within the context of the growth of crystals from said composition, said crystals generally being of formula $A_e Ln_f X_{(3f+e)}$ in which Ln represents one or more rare earths, X represents one or more halogen atoms chosen from Cl, Br or I, and A represents one or more alkaline metals such as K, Li, Na, Rb or Cs, e and f representing values such that e, which may be zero, is less than or equal to 2f and f is greater than or equal to 1. It is possible in this way to grow single crystals exhibiting remarkable scintillation properties.

22 Claims, No Drawings

METHOD FOR MANIPULATING A RARE EARTH CHLORIDE OR BROMIDE OR IODIDE IN A CRUCIBLE COMPRISING CARBON

The present application is the U.S. counterpart of WO 03/106741, the text of which is incorporated herein by reference and claims priority of French Application No. 02/07187 filed on Jun. 12, 2002, the text of which is incorporated herein by reference.

This application is a National stage application of PCT/FR03/01735 filed Jun. 11, 2003. Priority to French application 02/07187-filed Jun. 12, 2002 is claimed.

Rare-earth halides (in the following text, Ln is used to denote a rare earth), of the chloride, bromide or iodide type, especially when they are doped with cerium, and in particular cerium-doped $LnBr_3$ and cerium-doped $LnCl_3$, have very useful scintillation properties especially for applications in nuclear imaging (positron electron tomography or PET, gamma camera, and the like). To expoit these properties, it is necessary to obtain these compounds in the form of large crystals (especially single crystals) that are transparent in the 320-500 nm region within which $Ce^{III}$ emission takes place while retaining the III (reduced) valency. Moreover, the high chemical reactivity of rare-earth halides severely limits the choice of materials that can be used as crucibles. This type of crystal is usually prepared by pulling in an installation that includes an induction-heated crucible or a crucible heated by the radiation of resistive elements. The raw material used may be a source of impurities leading to undesirable black specks in the final crystal.

Rare-earth fluorides melt at very high temperatures, from 200 to 500° C. above other halides, and they are so corrosive with respect to oxides, such as silica, and with respect to precious metals (platinum) that, for the purpose of crystal growth, they can be handled only in a carbon crucible. In relation to such handling of fluorides, the following documents may be mentioned:

JP 03285898;
Blistanov et al., J. Crystal Growth 237-239 (2002), 899-903;
Duffy et al., J. Crystal Growth 203 (1999), 405-411;
U.S. Pat. No. 3,959,442; and
Korczak et al., J. Crystal Growth vol 61 (1983), No 3, (XP-002233142).

However, handling fluorides in a carbon crucible often leads to black specks in the crystal. In addition, for a person skilled in the art, the reaction between carbon and the melt is a priori weaker in the case of fluorides than in the case of the other halides, because chlorides, bromides and iodides are much more hygroscopic than fluorides. In fact, water or its derivatives present in the raw materials is known to attack graphite, with the creation of black specks in the final crystal. This is why, whenever a material other than carbon can be used, because not fluorides but chlorides or bromides or iodides are being handled, other materials such as silica or platinum are then used. This is because a person skilled in the art would expect to see many black specks when handling raw-earth halides of the chloride, bromide or iodide type, since he has already seen such specks when growing $BaF_2$ or $LaF_3$ crystals (these two crystals are prepared in a very similar manner and are analogous as regards their preparation). However, the Applicant has discovered that it is possible to use a carbon-containing crucible for handling rare-earth chlorides or bromides or iodides with even fewer drawbacks than with a silica crucible.

The invention relates to the handling of a composition comprising a rare-earth halide, essentially of the chloride, bromide or iodide type, especially for growing crystals from said composition, said crystals generally being of formula $A_eLn_fX_{(3f+e)}$ in which Ln represents one or more rare earths, X represents one or more halogen atoms chosen from Cl, Br or I, and A represents one or more alkali metals such as K, Li, Na, Rb or Cs, e and f representing values such that:

e, which may be zero, is less than or equal to 2f;
f is greater than or equal to 1.

The rare earths (in the form of halides) concerned are those of Column 3 (according to the new notation mentioned in *Handbook of Chemistry and Physics* 1994-1995, 75$^{th}$ edition) of the Periodic Table of the Elements, including Sc, Y, La and the lanthanides from Ce to Lu. More particularly concerned are the halides Y, La, Gd and Lu, especially those doped with Ce or Pr (the term "dopant" referring here to a minority rare earth substituting for one or more majority rare earths, the minority and majority values being included below the symbol Ln). The rare-earth halides relating to the present application may be represented by $LnX_3$ in which Ln represents the rare earth and X represents a halogen atom, which may be Cl, Br or I.

The compositions containing a rare-earth halide more particularly concerned are especially the following:

$ALn_2X_7$ in which Ln represents one or more rare earths, X represents one or more halogen atoms chosen from Cl, Br or I, A represents an alkali metal such as Rb and Cs;

$LaCl_3$ possibly doped in particular with 0.1 to 50% $CeCl_3$ by weight;

$LnBr_3$ possibly doped in particular with 0.1 to 50% $CeBr_3$ by weight;

$LaBr_3$ possibly doped in particular with 0.1 to 50% $CeBr_3$ by weight;

$GdBr_3$ possibly doped in particular with 0.1 to 50% $CeBr_3$ by weight;

$La_xLn_{(1-x)}X_3$, possibly doped in particular with 0.1 to 50% $CeX_3$, x possibly ranging from 0 to 1, Ln being a rare earth different from La, X being a halogen as mentioned above;

$La_xGd_{(1-x)}Br_3$ possibly doped in particular with 0.1 to 50% $CeBr_3$, x possibly ranging from 0 to 1;

$La_xLu_{(1-x)}Br_3$ possibly doped in particular with 0.1 to 50% $CeBr_3$, x possibly ranging from 0 to 1;

$Ln'_xLn''_{(1-x)}X'_{3(1-y)}X''_{3y}$ in which Ln' and Ln'' are two rare earths different from the Ln type, X' and X'' being two halogens different from the X type, especially Cl and Br, x possibly ranging from 0 to 1, y possibly ranging from 0 to 1;

$RbGd_2Br_7$ possibly doped in particular with 0.1 to 50% $CeBr_3$ by weight;

$RbLn_2Cl_7$ possibly doped in particular with 0.1 to 50% $CeCl_3$ by weight;

$RbLn_2Br_7$ possibly doped in particular with 0.1 to 50% $CeBr_3$ by weight;

$CsLn_2Cl_7$ possibly doped in particular with 0.1 to 50% $CeCl_3$ by weight;

$CsLn_2Br_7$ possibly doped in particular with 0.1 to 50% $CeBr_3$ by weight; and $K_2LaCl_5$ possibly doped in particular with 0.1 to 50% $CeCl_3$ by weight.

The composition generally contains no fluorine. Any rare-earth halide in the composition is therefore essentially of the chloride, bromide or iodide type (and this includes mixed halides of this type). Thus, the invention relates in particular to a method for handling a composition comprising $LaCl_3$ and/or $LaBr_3$ and/or $GdBr_3$ and/or $La_xGd_{(1-x)}Br_3$ with x ranging from 0 to 1, and where appropriate $CeCl_3$ and/or CeBr$_3$. The composition may also include an ammonium halide. The composition generally comprises at least 10% by weight of rare earth and more generally at least 20% by weight of rare earth. The composition rich in rare-earth halide generally comprises at least 80% and more generally at least 90% or even at least 99% by weight of halide of formula A$_e$Ln$_f$X$_{(3f+e)}$ already mentioned.

It is an object of the invention in particular to use a crucible made of graphite or amorphous carbon and in particular a graphite crucible coated with a pyrolytic coating for the growth of crystals that comprise a rare-earth halide, especially one whose formula is one of those mentioned above. Such a use must be under scarcely oxidizing conditions, preferably under an oxygen+water partial pressure of less than 10 millibars, preferably in a vacuum or in the presence of an inert gas such as nitrogen or argon.

To grow rare-earth halide crystals, it is customary to use sealed silica (SiO$_2$) containers or platinum crucibles. However, rare-earth halides have a tendency to stick to these materials so that it is difficult to extract them from the crucible. Fractures in the rare-earth halide or in the crucible may occur if it is attempted to extract the halide when cold (in the solid state). Moreover, if the surface of the halide is reheated in order to extract it, the high temperatures necessary (above 800° C.) result in undesirable oxidation, and there is also a risk of the thermal shock causing it to break. In addition, platinum is very expensive. Moreover, silica crucibles have a low thermal conductivity but are transparent to thermal radiation, which makes it complicated to control the temperature and consequently the crystal growth. In order for the heat transfer to be fully controlled, a thermally conducting radiation-opaque crucible is preferable.

If a graphite crucible is used for growing CaF$_2$ or BaF$_2$ or TI:NaI crystals, small graphite particles are observed, these being included within the crystals produced, said small particles being highly detrimental to the optical properties of said crystals, particularly for transmission in the near UV. This shows that it is difficult a priori to anticipate the applicability of a material as crucible.

WO 01/60944 and WO 01/60945 teach the use of sealed SiO$_2$ containers for containing a rare-earth halide.

U.S. Pat. No. 5,911,824 and U.S. Pat. No. 6,093,245 teach the use of graphite crucibles for growing NaI single crystals. However, the growth of such NaI crystals in a graphite crucible results in crystals of poor quality for applications as scintillating crystals, as they contain graphite inclusions.

The invention relates to the use of a material comprising at least 20% carbon by weight for coming into contact, especially at a temperature above 500° C., with a composition comprising a rare-earth halide, and especially for growing a single crystal comprising a rare-earth halide. The invention also relates to a method of handling a composition comprising a rare-earth halide by means of a material comprising at least 20% carbon by weight, said composition coming into contact, in the molten state, with said material at a temperature above 500° C.

Within the context of the present application, the term "material rich in carbon" is understood to mean an opaque material containing at least 20% carbon by weight. Such a material may, for example, be made of graphite, amorphous carbon (or vitreous carbon), of graphite coated with pyrolytic carbon, of graphite coated with silicon carbide, of graphite coated with boron nitride (possibly pyrolytic boron nitride).

The term "handling" must be taken in its general sense since it covers simple contact between the material and the composition and the simple fact of the material being a container for the composition comprising the halide, as is the case of a crucible. Thus, the invention also relates to a method using the carbon-rich material for forming part of a crucible and for coming into contact with the composition comprising a rare-earth halide. The material may comprise, on the one hand, a graphite substrate and, on the other hand, a coating, this coating possibly being made of pyrolytic carbon or silicon carbide or boron nitride. (possibly pyrolytic boron nitride). When such a coating is present, the carbon-rich material comes into contact with the composition via the coating. The coating serves in particular to block any pores in the graphite.

The composition may be in the molten or solid state, as occurs during the growth of a rare-earth halide single crystal. This is because, for such growth, a composition comprising a rare-earth halide is firstly melted in a crucible and then a crystallization procedure is carried out in order to grow the single crystal. In such a process, the crucible is in contact with a composition comprising a molten rare-earth halide and with a rare-earth halide single crystal.

The invention solves the abovementioned problems since, by using a carbon-rich material as crucible for growing a single crystal comprising rare-earth halide, it is found to be easy to recover the crystal when cold, without having to melt its surface, said crystal also being free of black specks that can be attributed to contamination within its mass. This is not observed in the case of NaI, even at a low pull rate, that is to say even at a growth rate of less than 5 mm/h. Moreover, we have observed, surprisingly, that, with the use of the same raw material in the same furnace at the same pull rate, growth in a silica crucible results in black specks within the mass, unlike growth according to the invention. Without the present explanation being able to limit the scope of the present invention, it is possible for the particles, especially graphite particles, that may especially come from the graphite heating elements or even from the raw material, to be more easily adsorbed by the walls of the crucible when the latter contains a composition comprising a rare-earth halide.

If the carbon-rich material is used as a crucible, especially for Bridgeman growth, it has been found to be easy to remove the crystal from the crucible. This shows that said crystal is barely stressed during cooling and there is therefore little risk of it breaking. It may also be mentioned that carbon-rich materials, such as graphite, are reasonably priced and can be easily fashioned to any shape. Moreover, since graphite is a reducing agent, if graphite actually comes into contact with the composition, said graphite protects the bath from oxidation, and this makes it possible, in the case of doped products, to stabilize the doping rare earth in its reduced valency (for example, Ce stabilized in valence III). A crucible made of a material containing at least 20% carbon by weight can be used several times, that is to say at least five times, or even at least ten times, in order to come into contact with a composition comprising a rare-earth halide, the crucible returning each time to room temperature. The use of such a crucible for handling a composition comprising a rare-earth halide, and especially for the growth of a rare-earth halide single crystal from a molten composition comprising a rare-earth halide, is therefore particularly advantageous. The invention also relates to the use of the same crucible at least five times or even at least ten times for implementing a method according to the invention.

The expression "material containing at least 20% carbon by weight" denotes any material containing overall at least 20% carbon, even if the carbon is not uniformly distributed in said material (for example a material comprising a graphite substrate and a boron nitride coating). It is also possible to use a material whose surface in contact with the composition comprising the rare-earth halide also itself contains at least 20% carbon by weight, for example:

- a material comprising a graphite substrate and a pyrolytic carbon coating;
- a material comprising a graphite substrate and a silicon carbide coating; and
- a material made entirely of graphite (with no coating).

Preferably, the entire object having its surface coming in contact with the composition comprising the rare-earth halide also contains at any point in its composition at least 20% carbon.

The surface in contact with the carbon-rich material may contain at least 90% carbon by weight. The entire object having its surface coming into contact with the composition comprising the carbon rare-earth halide may contain at least 90% carbon by weight.

The carbon-rich material may, for example, be entirely made of graphite. Preferably, it may be graphite coated with a pyrolytic carbon layer, said layer being intended to come into contact with the composition comprising the rare-earth halide, because of the smooth surface finish and low porosity state provided by said layer. It may also be graphite coated with a silicon carbide layer, said layer being intended to come into contact with the composition comprising the rare-earth halide.

When an uncoated graphite is used, it is preferable to use a graphite that is the least dense possible, that is to say one having the lowest possible open porosity, for example an open porosity of less than 10% by volume. It is preferably used to come into contact with the composition comprising the rare-earth halide in nitrogen or in a vacuum.

Within the context of the method according to the invention, the contact may take place between 20° C. and 1000° C. The invention is more particularly beneficial for temperatures of between 500° C. and 1000° C. and especially when the composition comprising a rare-earth halide is in the molten state.

The growth of this crystal may be carried out using known techniques such as Bridgeman growth or Kyropoulos growth or Czochralski growth or growth using the gradient freeze method. Preferably, the crystal is pulled by a controlled growth rate of less than 5 mm/h. The advantages inherent in the invention are particularly useful in Bridgeman growth. The crystal may be pulled in a conventional apparatus, that is to say one in which the crucible is heated by heating elements made of graphite. This is because, even though these graphite heating elements also represent one possible crystal contamination factor, it appears that the crucible used within the context of the invention has a role of attracting the graphite particles. Thus, the invention also relates to a method in which the opaque material, especially of the crucible type, is heated by graphite heating elements.

EXAMPLE 1

Anhydrous $LaCl_3$ 50 g of $CeCl_3$ were incorporated into a 500 g charge of anhydrous $LaCl_3$ in the form of a powder having a mean particle size of about 500 μm. The combination was put into a graphite furnace (graphite heating elements). The system was taken up to 300° C. under a high vacuum (pressure less than $1 \times 10^{-4}$ millibar) and then a stream of nitrogen established. The product was melted in a graphite crucible. Bridgeman growth was carried out at a pull rate of between 1 and 3 mm/h. The crystal obtained was clear (no black specks) and did not stick to the crucible.

EXAMPLE 2

$LaBr_3$ 15 g of $NH_4Br$ were incorporated into a 500 g charge of anhydrous $LaBr_3$ in the form of a powder having a mean particle size of about 500 μm. The combination was put into a graphite furnace. The system was taken to 170° C. under vacuum and then a nitrogen stream established. The product was melted in a graphite crucible. Bridgeman growth was carried out. The crystal obtained was clear (no black specks) and it did not stick to the crucible.

EXAMPLE 3 (COMPARATIVE EXAMPLE)

$LaCl_3$/Silica Crucible 50 g of anhydrous $LaCl_3$ in the form of a powder were put into a silica crucible placed in a sealed furnace. The system underwent a vacuum purge and then a nitrogen stream was established. The temperature was increased until complete melting of the charge (about 900° C.). After cooling, the $LaCl_3$ crystals and the silica crucible were bonded together and the combination was fractured.

EXAMPLE 4 (COMPARATIVE EXAMPLE)

$LaCl_3$/Platinum Crucible 40 g of anhydrous $LaCl_3$ in the form of a powder were put into a platinum crucible placed in a sealed furnace. The system underwent a vacuum purge and then a nitrogen stream was established. The temperature was increased until complete melting of the charge (i.e. about 900° C.). After cooling, the $LaCl_3$ crystals and the platinum crucible were bonded together. It was not possible to remove the crystals without cold fracturing.

EXAMPLE 5 (COMPARATIVE EXAMPLE)

$BaF_2$/Graphite Crucible Under Vacuum

A 1000 g charge of $BaF_2$ containing about 800 ppm oxygen by weight was placed in a graphite furnace. The system was taken up to 1360° C., under a high vacuum, until the charge melted. The product was melted in a graphite crucible. Bridgeman growth was carried out. The crystal obtained was clear, but contained black specks and gas bubbles. Many black specks were observed on the heel of the crystal. The crystal stuck to the crucible slightly, this being the result of the presence of black traces on the surfaces of the crystal that were in contact with the graphite. The transmission of this crystal was severely degraded in ultraviolet.

EXAMPLE 6

$LaCl_3$/Graphite Crucible Coated with Pyrolytic C 55 g of anhydrous $CeCl_3$ were incorporated into a 504 g charge of anhydrous $LaCl_3$ in the form of a powder. The combination was put into a graphite furnace. The system was taken up to 300° C. under a high vacuum (pressure less than $1 \times 10^{-4}$ millibar) and then a nitrogen stream established.

The product was melted in a crucible made of graphite coated with a pyrolytic carbon coating. Bridgeman growth was carried out. The single crystal obtained was clear without any black specks and did not stick to the crucible. When excited by 622 keV γ radiation ($^{137}$Cs), the light intensity emitted was 118% of that of a Tl:NaI crystal (reference scintillator crystal). This reflects the good crystal properties of the lanthanum halide, particularly from the standpoint of stabilizing the cerium (the active ion for scintillization) in valency III.

EXAMPLE 7

LaBr$_3$/Graphite Crucible Coated with Pyrolytic C 0.5% CeBr$_3$ by weight was incorporated into a 911 g charge of anhydrous LaBr$_3$. The combination was put into a graphite furnace. The system was taken up to 600° C. under a vacuum and then a nitrogen stream established. The product was melted at about 820° C. in a crucible made of graphite coated with pyrolytic carbon. Bridgeman growth was carried out. The crystal obtained was free of black specks and did not stick to the crucible.

EXAMPLE 8 (COMPARATIVE EXAMPLE)

LaBr$_3$/Silica Crucible 0.5% CeBr$_3$ by weight was incorporated into a 743 g charge of anydrous LaBr$_3$ (coming from the same batch as in the case of example 7). The material was identical to that of the previous test. The combination was put into a graphite furnace. The system was taken up to 820° C. under vacuum. The product was melted at about 820° C. in a transparent silica crucible. Bridgeman growth was carried out. The crystal obtained contained many black specks (unlike the previous example) in the central zone. The interface with the crucible was highly fractured.

EXAMPLE 9

LaCl$_3$/Graphite Crucible Coated with Pyrolytic BN 50 g of anhydrous LaCl$_3$ in the form of a powder were placed in a crucible made of graphite coated with pyrolytic BN and then placed in a sealed furnace. A vacuum purge operation was carried out and a nitrogen stream established. The temperature was increased until complete melting of the charge (about 900° C.). The crystal did not stick to the crucible. After cooling, the cast block, free of black specks, was easily removed from the crucible.

EXAMPLE 10

LaBr$_3$/Graphite Crucible Coated with Pyrolytic BN 50 g of anhydrous LaBr$_3$ in the form of a powder were placed in a crucible made of graphite coated with pyrolytic BN and then placed in a sealed furnace. A vacuum purge operation was carried out and a nitrogen stream established. The temperature was increased until complete melting of the charge (about 900° C.). After cooling, the cast block, free of black specks, was easily removed from the crucible. The crystal did not stick to the crucible.

EXAMPLE 11 (COMPARATIVE EXAMPLE)

NaI/Graphite Crucible

A 100 kg charge of NaI doped with 1000 ppm thalium iodide by weight was put into a crucible made of graphite coated with a pyrolytic carbon coating. This crucible was then put into a Bridgeman furnace (in which normally platinum crucibles are used) and subjected to a standard NaI Bridgeman growth cycle. The crystal was annealed in situ. The crystal obtained was easily demolded from the crucible when cold. The end of the crystallization (called the heel of the crystal) was gray and contained traces of carbon. The crystal had clouds of inclusions and the energy resolution on two-inch components was greater than 8.5% at 622 keV, which is insufficient for a standard NaI crystal. The scintillation properties of this crystal (light yield per γ photon and energy resolution) are substantially degraded compared with a crystal obtained in a platinum crucible with the same raw material.

EXAMPLE 12

LaCl$_3$/Graphite Crucible; Kyropoulos Growth 155 g of anhydrous CeCl$_3$ were incorporated into a 1504 g charge of anhydrous LaCl$_3$ in the form of a powder. The combination was put into a graphite furnace. The system was taken up to 300° C. under vacuum (pressure less than 1.0 millibar) and a stream of nitrogen established. The product was melted in a graphite crucible. Kyropoulos growth was carried out (by dipping an LaCl$_3$ seed into the molten bath). The crystal obtained was clear, without any black specks. The residue of the molten bath did not stick to the crucible, allowing the crucible to be

The invention claimed is:

1. A method of handling a composition comprising placing a composition into contact with a material wherein said composition is in the molten state and said composition comprises at least 80% by weight of a rare-earth halide of formula $A_e Ln_f X_{(3f+e)}$ wherein Ln represents one or more rare earth elements, X represents one or more halogen atoms chosen from Cl, Br and I, and A represents one or more alkali metals chosen from K, Li, Na, Rb and Cs, e and f representing values such that:

e, which may be zero, is less than or equal to 2f, f is greater than or equal to 1, wherein said material comprises at least 20% carbon by weight, the surface of said material that is in contact with said composition comprises at least 20% carbon by weight and said composition in the molten state coming into contact with said material is at a temperature above 500° C.

2. The method as claimed in claim 1, wherein the material forms part of a crucible.

3. The method as claimed in claim 2, wherein the same crucible is used in the method at least five times, the crucible returning to ambient temperature between each time.

4. The method as claimed in claim 2, wherein the same crucible is used in the method at least ten times, the crucible returning to ambient temperature between each time.

5. The method as claim 1, wherein the material comprises graphite or amorphous carbon.

6. The method as claimed in claim 5, wherein the material comprises a graphite substrate and a lining intended to come into contact with the composition comprising the rare-earth halide.

7. The method as claimed in claim 6, wherein the lining is made of pyrolytic carbon.

8. The method as claimed in claim 6, wherein the lining is made of silicon carbide.

9. The method as claimed in claim 5, wherein the material is entirely made of graphite or of amorphous carbon.

10. The method as claimed in claim 1, wherein contact takes place between 500° C. and 1000° C.

11. The method as claimed in claim 1, wherein the composition comprises at least 10% by weight of at least one rare earth element.

12. The method as claimed in claim 1, wherein the composition comprises at least 20% by weight of at least one rare earth element.

13. The method as claimed in claim 1, wherein the handling is carried out under an oxygen/water partial pressure of less than 10 millibars.

14. The method as claimed in claim 1, wherein the handling takes place within the context of the growth, from the composition, of a single crystal comprising the rare-earth halide.

15. The method as claimed in claim 14, wherein the growth is carried out with a growth rate of less than 5 mm/h.

16. The method as claimed in claim 14, wherein the growth is of the Bridgeman type.

17. The method as claimed in claim 14, wherein the growth is of the Kyropoulos or Czochralski type.

18. The method as claimed in claim 14, wherein the single crystal is of formula $A_e Ln_f X_{(3f+e)}$ in which Ln represents one or more rare earth elements, X represents one or more halogen atoms chosen from Cl, Br and I, and A represents one or more alkali metals chosen from K, Li, Na, Rb and Cs, e and f representing values such that:

e, which may be zero, is less than or equal to 2f, f is greater than or equal to 1.

19. The method as claimed in claim 18, wherein the single crystal is of formula $ALn_2X_7$ in which Ln represents one or more rare earth elements and X represents one or more halogen atoms, chosen from Cl, Br and I, A representing Rb or Cs.

20. The method as claimed in claim 18, wherein the composition comprises $LaCl_3$ and/or $LaBr_3$ and/or $GdBr_3$ and/or $La_xGd_{(1-x)}Br_3$ with x ranging from 0 to 1.

21. The method as claimed in claim 18, wherein the composition also comprises $CeCl_3$ and/or $CeBr_3$.

22. The method as claimed in claim 1, wherein the material is heated by graphite elements.

* * * * *